United States Patent
Witowski et al.

(10) Patent No.: US 8,515,714 B2
(45) Date of Patent: Aug. 20, 2013

(54) CURVE MATCHING FOR PARAMETER IDENTIFICATION

(75) Inventors: Katharina Witowski, Rutesheim (DE); Nielen Stander, Pleasanton, CA (US)

(73) Assignee: Livermore Software Technology Corp., Livermore, CA (US)

( * ) Notice: Subject to any disclaimer, the term of this patent is extended or adjusted under 35 U.S.C. 154(b) by 304 days.

(21) Appl. No.: 13/048,322

(22) Filed: Mar. 15, 2011

(65) Prior Publication Data

US 2011/0301920 A1 Dec. 8, 2011

Related U.S. Application Data

(63) Continuation-in-part of application No. 12/792,700, filed on Jun. 2, 2010.

(51) Int. Cl.
*G06F 7/60* (2006.01)
*G06F 17/10* (2006.01)

(52) U.S. Cl.
USPC ............................................................. 703/2

(58) Field of Classification Search
USPC ............................................................. 703/2
See application file for complete search history.

(56) References Cited

PUBLICATIONS

Yu-Chieh Lo et al, "An Effective Algorithm Based on Curve Fitting for Measuring Protein Structure Similarity", CSE NSYSSU.EDU. TW Dec. 2006.*
Femiani, et al, "Curve Shapes: Comparison and Alignment", ASU. edu, Oct. 22, 2004; https://i3dea.asu.edu/data/docs_pubs/curve_shapes_comparison_and_alignment.pdf.*

* cited by examiner

*Primary Examiner* — David Silver
(74) *Attorney, Agent, or Firm* — Roger H. Chu

(57) ABSTRACT

Methods and systems for matching a computed curve to a target curve to enable realistic engineering simulations are disclosed. Optimization of parameter identification is achieved by adjusting the parametric inputs of a simulation model such that the discrepancy between the two curves is minimized. Because the points on the two curves to be matched are paired, matching of any two open curves, including hysteretic curves, can be handled. Curves that are completely set apart in their original coordinates can be merged to a common coordinate system for parameter identification without the computational instability problems. A partial matching scheme is used for mapping points defining the shorter one of the two curves to a set of mapped points on the longer one. One or more offsets from the first point of the longer curve are used for multiple attempts to find a best fit.

12 Claims, 9 Drawing Sheets

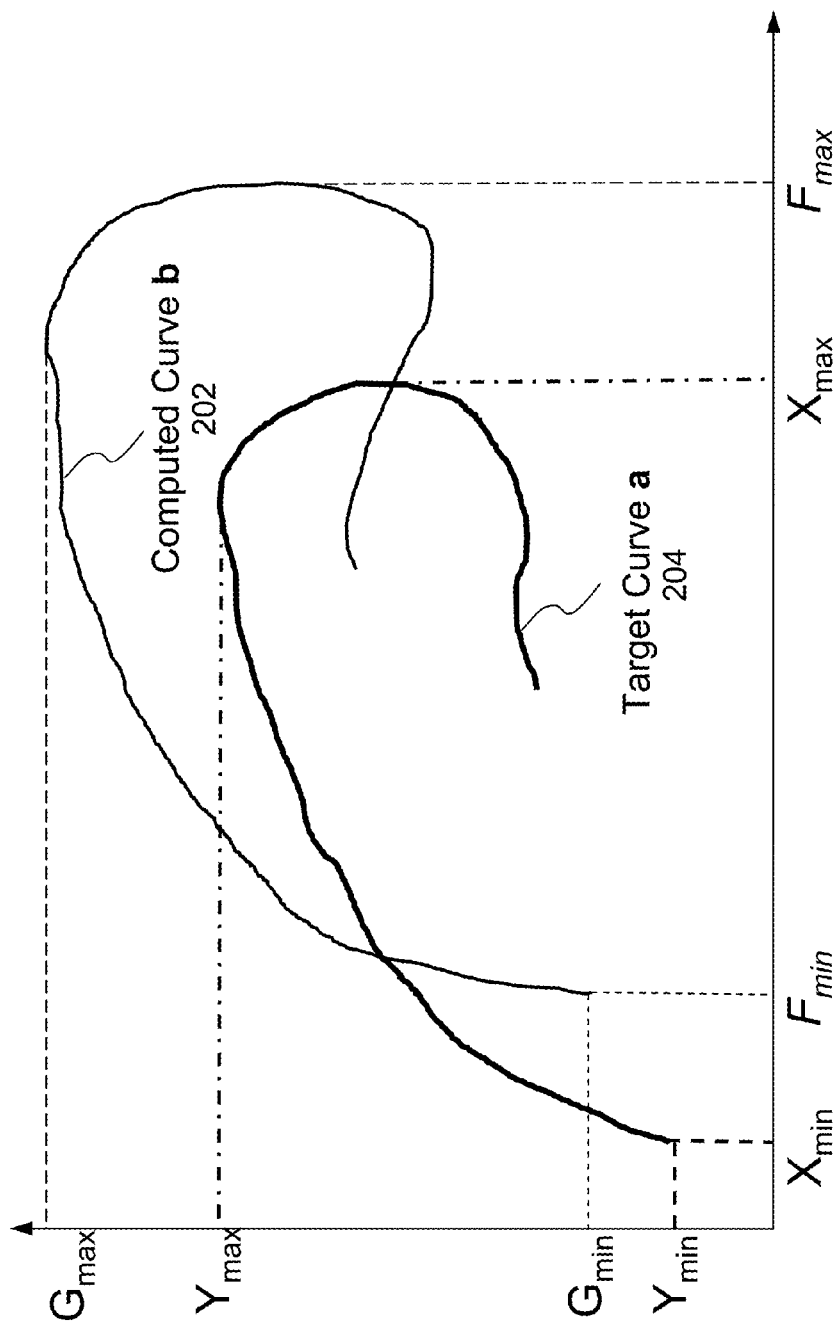

CURVE MATCHING FOR PARAMETER IDENTIFICATION

CROSS REFERENCE TO RELATED APPLICATIONS

This application is a continuation-in-part of co-pending U.S. patent application for the same title, Ser. No. 12/792,700, filed on Jun. 2, 2010.

FIELD OF THE INVENTION

The present invention generally relates to system identification used in engineering simulation of measured results, more particularly to methods for matching a computed curve to a target curve to enable the calibration of systems or material properties, so that realistic engineering simulations of the systems or materials can be carried out in a computer. Engineers and scientists use results of such simulations to improve design of engineering products.

BACKGROUND OF THE INVENTION

In a multiple-input dynamic model, the output is a combination of the response of each of the inputs. If the system inputs are observable, meaning the process or contribution of each input can be readily known or determined, then the output may be controlled by directly changing the related inputs. However, in a large complex system, not every input is observable. For a system with unobservable inputs, because the output cannot be directly related to an input, control and optimization of the system is more difficult. A common approach to determine how each input affects the results of an output is to measure the response of a system with known multiple inputs and try to deduce a mathematical relationship between the inputs and the outputs without going into the details about how the system reacts to each individual input. This kind of approach in determining the input-output relationship is called system identification, or parameter identification.

It is noted that "input" can also be "design". Each different "input" can be a different "design".

The goal of performing a system identification process is to produce a result that is as close to the desired physical system output as possible by adjusting the inputs of the system. In numerical simulation applications, the parameter identification, or system identification, is to control the parametric inputs of a mathematical model, which is constructed to simulate a system, such that the output of the simulation is closely matching the system output.

In certain applications, the outputs are presented in two-dimensional (2-D) curves, for example, material properties in terms of strain-stress relationship. Generally, it is desirous for a user (e.g., engineer and/or scientist) to use a computer to generate a computed or simulated curve to match a target curve, such that a computer simulation can be performed to product realistic predictions. One such example is to generate a computed curve to match material properties obtained in a physical specimen test.

Matching a target curve having characteristic of monotonic increase in one coordinate is very simple, for example, using the ordinate difference between two curves as a system identification parameter.

However, matching a computed curve to a non-monotonically increased target curve is not straightforward, for example, when the target curve exhibits hysteretic behaviors. In this situation, both the target curve and the computed curve have more than one possible ordinate value for each value of the abscissa. Hence, if an abscissa value is used to find the matching value on the computed curve, the interpolated ordinate value would be non-unique.

Another problem in matching two curves is related to engineering optimization. During an iterating interim stage of optimization, the computed curve and the target curves can be completely disengaged, i.e., they do not share any common value in one coordinate of a 2-D curve. Under this situation, the optimization iteration process may become computational unstable and fails.

Furthermore, test data obtained in a specimen test may contain noises or superfluous data points in a specimen test. Sometimes, data obtains cover only a portion of response. In these circumstances, a partial matching of the test curve (i.e., target curve) to the computed curve is desired.

Therefore, it would be desirable to have an improved method and system for matching a computed curve to a target curve to enable realistic computer aided engineering simulations.

SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

The present invention pertains to methods and systems for matching a computed curve to a target curve to enable realistic engineering simulations. For example, material behaviors (e.g., strain versus stress relationship) are measured as a target curve from a specimen test first. Next, a computed curve is created for matching the target curve. The computed curve is then used in a computer aided engineering analysis to represent the material behaviors. Discrepancies between the computed curve and the target curve are measured, and based on the discrepancies, decisions on how to adjust parametric inputs can be made to calibrate a system or material. An exemplary stress versus stretch-ratio curve for polymeric material shown in FIG. 1. The stretch-ratio is directly proportional to the strain.

Optimization of parameter identification is achieved by adjusting the parametric inputs of a simulation model such that the discrepancy between the two curves is minimized. Because the points on the two curves to be matched are paired, matching of any two open curves, including hysteretic curves, can be handled. Curves that are completely set apart in their original coordinates can be merged to a common coordinate system for parameter identification without the computational instability problems.

According to one aspect of the present invention, a target curve is represented by "m" points (i.e., a first set of points) while a computed curve represented by "n" points (i.e., a second set of points). The computed curve is created for use in a computer aided analysis (CAE) model (e.g., finite element analysis model). The computed curve has a plurality of adjustable control or design parameters.

Each curve consists of a number of segments. Each segment is defined by two adjacent points of the particular set. For example, the target curve has "m−1" segments, while the computed curve has "n−1" segments.

According to another aspect, the target curve and the computed curve are compared to determine which one is shorter. Then the points defining the shorter curve are designated as a first set of points. The longer curve is defined by a second set of points. The first set of points is mapped to a set of mapped points (i.e., a third set of points) on a section of the longer curve. The total length of the section is equal to that of the shorter curve. In order to locate a matched section that satisfies a predefined matching criterion, one or more partial matching attempts are performed. Each matching attempt corresponds to an offset from the starting point of the longer curve. For example, a group of offsets are predetermined between zero and a maximum value (i.e., length difference between the longer and short curves). Further included in each partial matching attempt is that equal segment length is maintained between the first set of points and the set of mapped points (third set of points). Discrepancy measurement is conducted for each matching attempt. The attempt having the lowest discrepancy is the best match for the group.

According to one embodiment, the discrepancy measurement is a function of the distances between the corresponding points of two curves. According to another embodiment, the discrepancy measurement includes a volume component (i.e., area between two curves) under each segment of the pair of adjacent points.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 2 is a 2-D diagram showing an exemplary computed curve and a target curve to be matched, according to an embodiment of the present invention;

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1-5. However, those skilled in the art will readily appreciate that the detailed description given herein with respect to these figures is for explanatory purposes as the invention extends beyond these limited embodiments.

Figure 1:
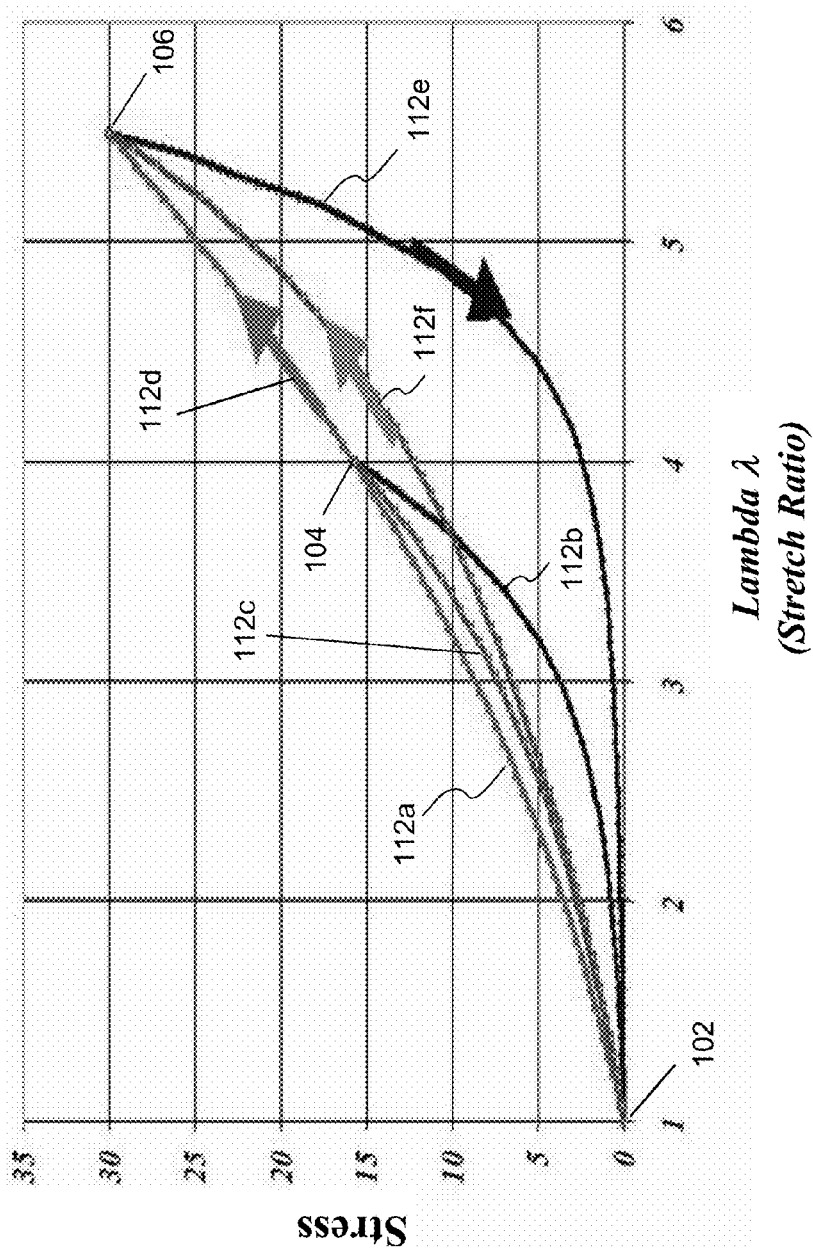
FIG. 1 is a diagram showing an exemplary target curve (stress versus stretch-ratio relationship of a polymeric material)

The present invention pertains to methods and systems for matching a computed curve to a target curve to enable the determination of input variables to a computed-aided engineering analysis model. An example is the determination of the properties (constants) of a material model used within a computer-aided engineering analysis model. Discrepancies between computed curve and the target curve are measured, and based on the discrepancies, decisions on how to adjust parametric inputs are made to achieve an optimal result of simulation. One exemplary target curve 100 is shown in FIG. 1. The curve 100 is a typical stress versus stretch-ratio ($\sigma$-$\lambda$) relationship obtained in a specimen test of polymeric material. Stretch-ratio ($\lambda$) is another form to define strain ($\epsilon$). The relationship is defined as $\lambda=1+\epsilon$. Curve 100 exhibits a hysteretic behavior. The $\sigma$-$\lambda$ relationship starts at an original state 102 (i.e., zero stress and stretch-ratio of one (no stretch)) following a first load path 112$a$ to a second state 104. Unloading from the second state 104 back to the original state 102 follows a second path 112$b$. Reloading from the original state 102 to a third state 106 via the second state is through third and fourth paths 112$c$-$d$. From the third state 106, unloading back to the original state 102 is through a fifth path 112$e$. Finally, another direct reloading from the original state 102 to the third state 106 is via a sixth path 112$f$.

According to one aspect of the invention, one objective is to use an application module (installed in a computer system) to create a corresponding set of points on a computed curve 202 that best matches a set of points defining the target curve 204. To show how this is done, FIG. 2 illustrates a computed curve 202 and a target curve 204. The target curve 204 ("Curve a") is bounded in a range from $X_{min}$ to $X_{max}$ and from $Y_{min}$ to $Y_{max}$. The computed curve 202 ("Curve b") has a bounded range from $F_{min}$ to $F_{max}$ and from $G_{min}$ to $G_{max}$. It is evident that the two curves do not have the same range in abscissa.

Figure 3A:
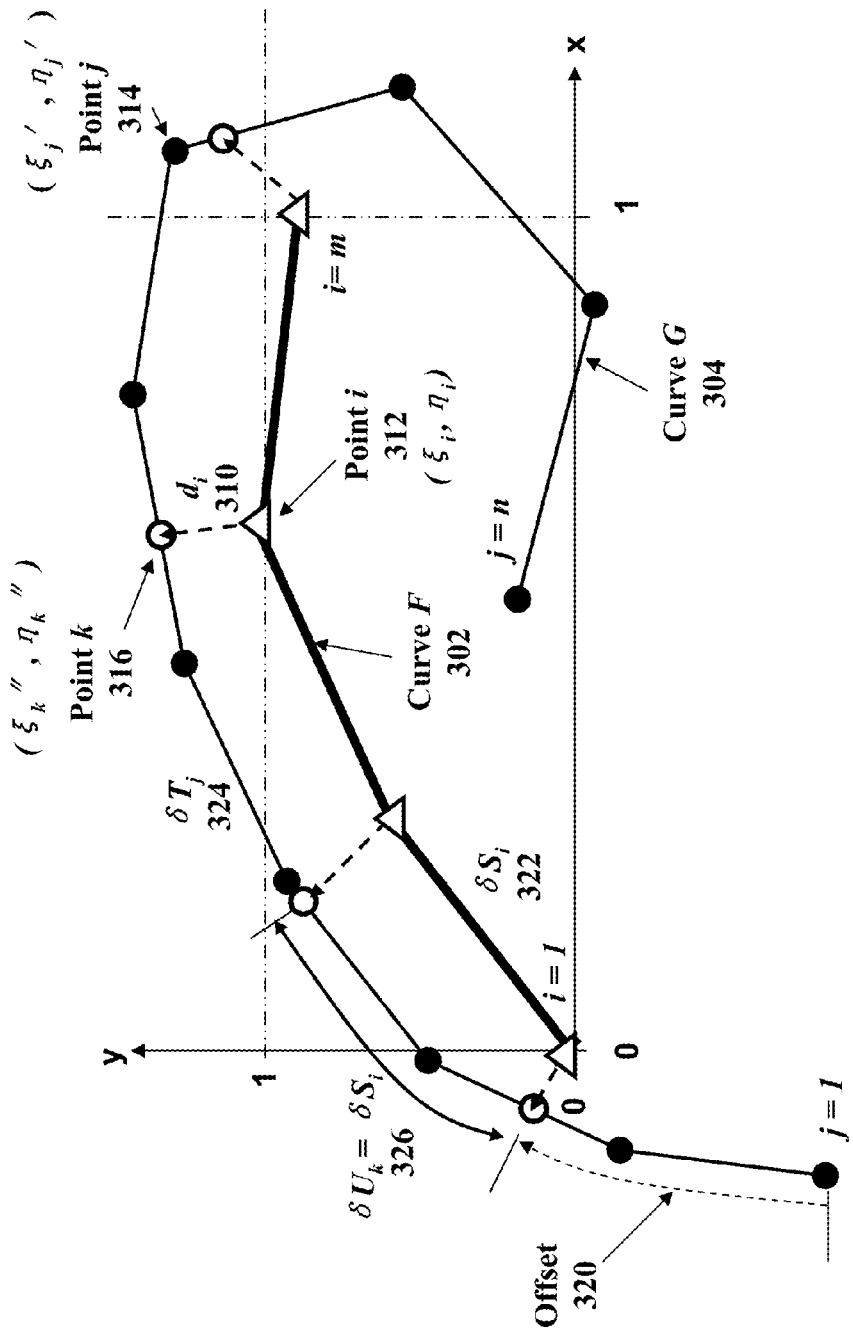
FIG. 3A is a 2-D diagram showing exemplary matching of a shorter curve to a section of a longer curve in a common normalized coordinate system and the mapping relationship between the two curves, according to an embodiment of the invention.

Instead of matching two curves in their entirety, partial matching is preferred in certain circumstances, for example, only portion of the test data is available, test data are unedited containing superfluous data points, etc. FIG. 3A is a diagram showing an exemplary mapping relationship of partial matching between two curves. A shorter curve ("Curve F" 302) is matched with a longer curve ("Curve G" 304). "Curve F" 302 is defined by a first set of points 312 (denoted by triangles, each has a coordinate ($\xi,\eta$)) while "Curve G" 304 is defined by a second set of points 314 (denoted by dots, each has a coordinate ($\xi'$,$\eta'$)). Located on "Curve G" 304, there is a third set of points or mapped points 316 (denoted by circles, each has a coordinate ($\xi''$,$\eta''$)). Each of the mapped points 316 is mapped from respective one of the first of points 312. Both curves are normalized to the shorter curve's maximum bounding ranges. Each corresponding pair of points between the first and third set is denoted with the distance $d_i$ 310.

Additionally, a segment is defined by connecting each pair of adjacent points. Segment $\delta S_i$ 322 is between two adjacent points of the first set, segment $\delta T_j$ 324 is between two adjacent points of the second set, and segment $\delta U_k$ 326 is between two adjacent points of the set of mapped points or the third set of points 316.

Figure 3B:
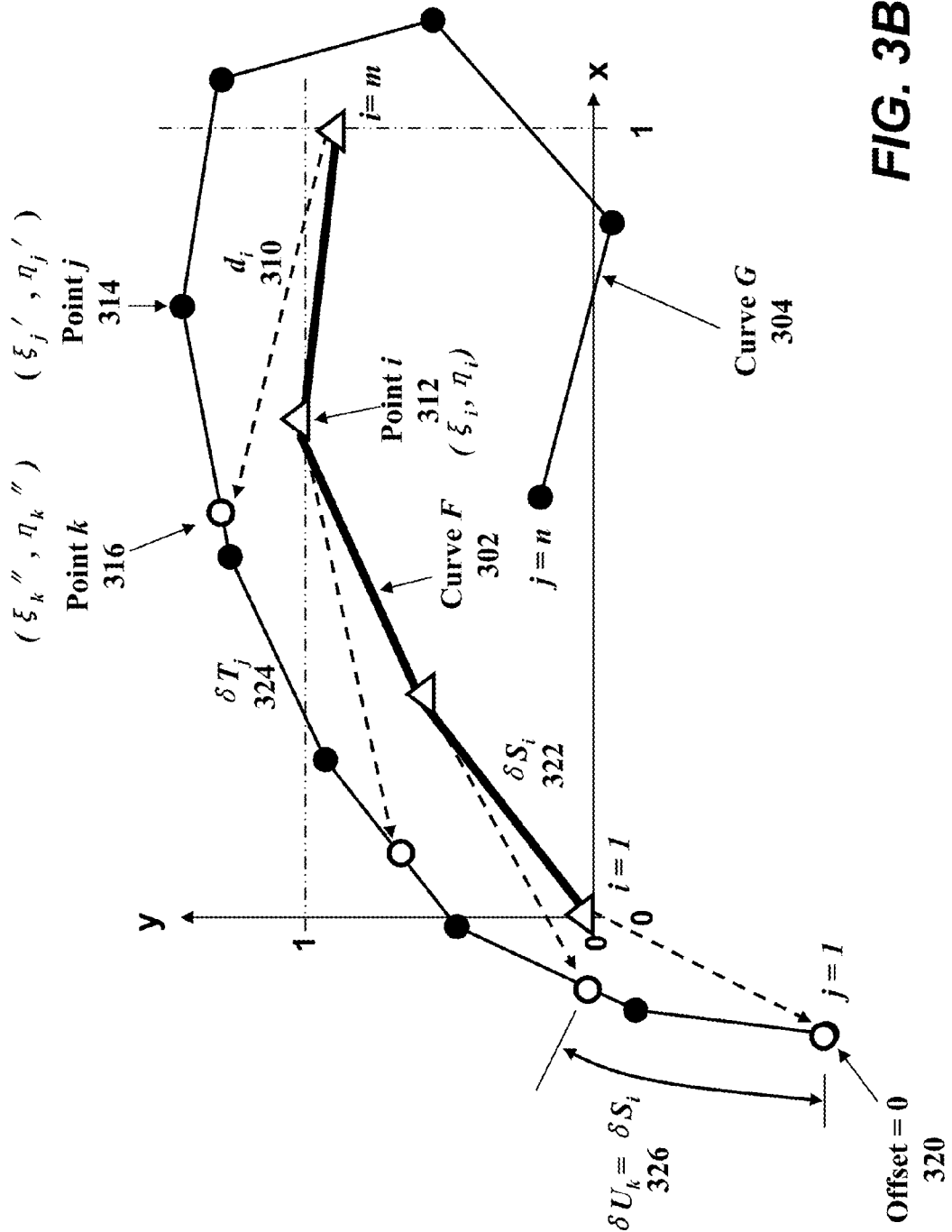
FIG. 3B is a 2-D diagram showing an exemplary matching attempt of a shorter curve to a section of a longer curve at zero offset, according to an embodiment of the present invention.
Figure 3C:
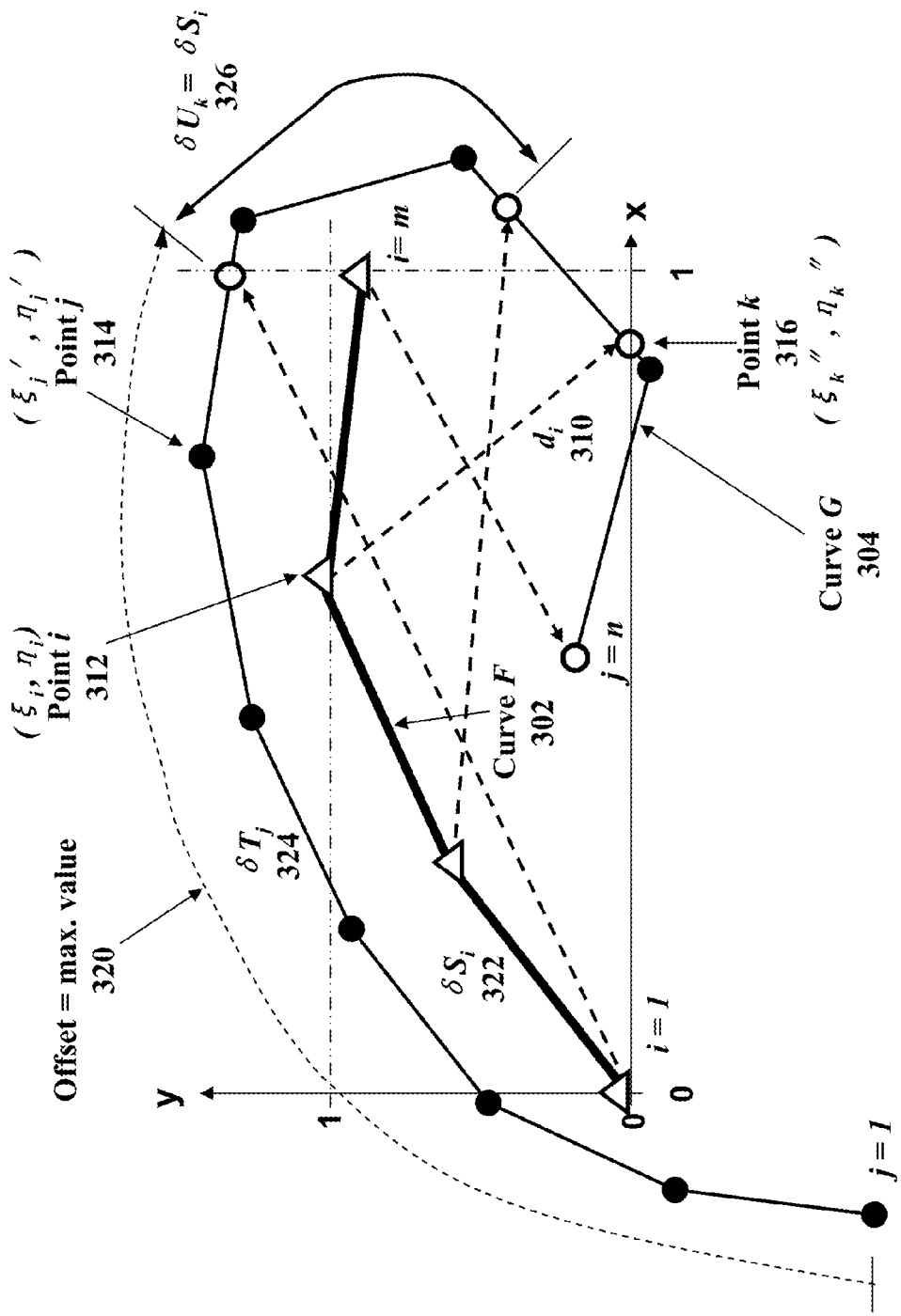
FIG. 3C is a 2-D diagram showing an exemplary matching attempt of a shorter curve to a section of a longer curve at maximum offset, according to an embodiment of the present invention.

An exemplary criterion for partial matching of the two curves is to ensure the length of a mapped segment $\delta U_k$ 326 is equal to that of corresponding segment $\delta S_i$ 322. When two curves have different length, it requires a number of matching attempts to ensure a best matching is reached. In one embodiment, a group of offsets 320 is established from zero to a maximum value, which is the polygon length difference between two curves. FIG. 3B shows an exemplary partial matching attempt when the offset 320 is zero. Offset 320 is at the maximum value shown in FIG. 3C.

To determine which one of the partial matching attempts is the best fit or matching, a discrepancy measurement is conducted for each attempt based on a certain formula. An attempt having the smallest discrepancy is designated as the best fit partial matching.

The algorithm for computing the curve mismatch error (e.g., discrepancy) is as follows:

1) Normalize the m point coordinates i of the target curve to its smallest bounding box or ranges to create "Curve F" 302 shown in FIG. 3A.

$$\xi_i = \frac{X_i - X_{min}}{X_{max} - X_{min}} \quad \eta_i = \frac{Y_i - Y_{min}}{Y_{max} - Y_{min}} \quad (1)$$

$$X_{min} = \min_k X_k; X_{max} = \max_k X_k;$$

$$Y_{min} = \min_k Y_k; Y_{max} = \max_k Y_k$$

2) Normalize the n point coordinates j of the computed curve to the same smallest bounding box to create "Curve G" 304.

$$\xi'_j = \frac{x_j - X_{min}}{X_{max} - X_{min}} \quad (2)$$

$$\eta'_j = \frac{y_j - Y_{min}}{Y_{max} - Y_{min}}$$

3) Compute S, the total polygon length of "Curve F" 302. Also compute the individual segment lengths $\delta S_i$ 322:

$$\delta S_i = \sqrt{(\xi_i - \xi_{i-1})^2 + (\eta_i - \eta_{i-1})^2}; i=2, 3, \ldots, m \quad (3)$$

Here a segment is defined as a part of the curve between two consecutive points, connected by a straight line.

4) Scale each segment length to the total curve length S:

$$\tilde{s}_i = \delta S_i / S; i=2, 3, \ldots, m \quad (4)$$

5) Compute T, the total polygon length of "Curve G" 304.
6) If S>T, swap two curves, the short curve is "Curve F" 302.
7) Define an offset 320 as a starting point of a curve section of total length S on "Curve G" 404. The offset is varied over a number of different positions (P) in order to "slide" the shorter curve along the longer curve. Offset has a range between zero and the length difference of the two curves (i.e., |T−S|). Assuming the number of partial matching attempts is P, each offset increment has size of |T−S|/P.

8) Set the offset to create a new section of the longer curve and create point coordinate pairs by mapping each point defining the shorter curve to the longer curve. The offset starts at zero initially for the first partial matching attempt, and is incremented by the offset increment at each subsequent attempt. As a result, the offset at the last attempt equals to |T−S| or the length difference of the two curves. A typical curve segment k on the longer curve which corresponds to a segment i on the shorter curve has length $\delta U_k = \delta S_i$ (see FIG. 3A). This creates a third set of points or a set of mapped points. The length of the mapped section of the long curve is equal to the length of the shorter curve.

9) Calculate the discrepancy (mismatch error) between the two curves. This is done by summing the volume component $v_i$ (area) representing the individual segment errors. First calculate the distances between the point pairs:

$$d_i = \sqrt{(\xi''_i - \xi_i)^2 + (\eta''_i - \eta_i)^2} \quad (5)$$

Then calculate the volume component (i.e., area between two curves) of each segment. (Note for m points, there are m−1 segments.)

$$v_i = \frac{d_i + d_{i-1}}{2} \times \tilde{s}_i; v_1 = 0; i = 2, 3, \ldots, m; \quad (6)$$

Then the discrepancy for the pth attempt is as follows:

$$\varepsilon_p = \sum_{i=1}^{m} v_i \quad (7)$$

10) Set p=p+1 and repeat points 8 and 9 until p=P.
11) Find the discrepancy $$\varepsilon = \min_p \varepsilon_p.$$

This is the best match between the two curves (i.e., the one has minimum discrepancy of all partial matching attempts).

Figure 4A:
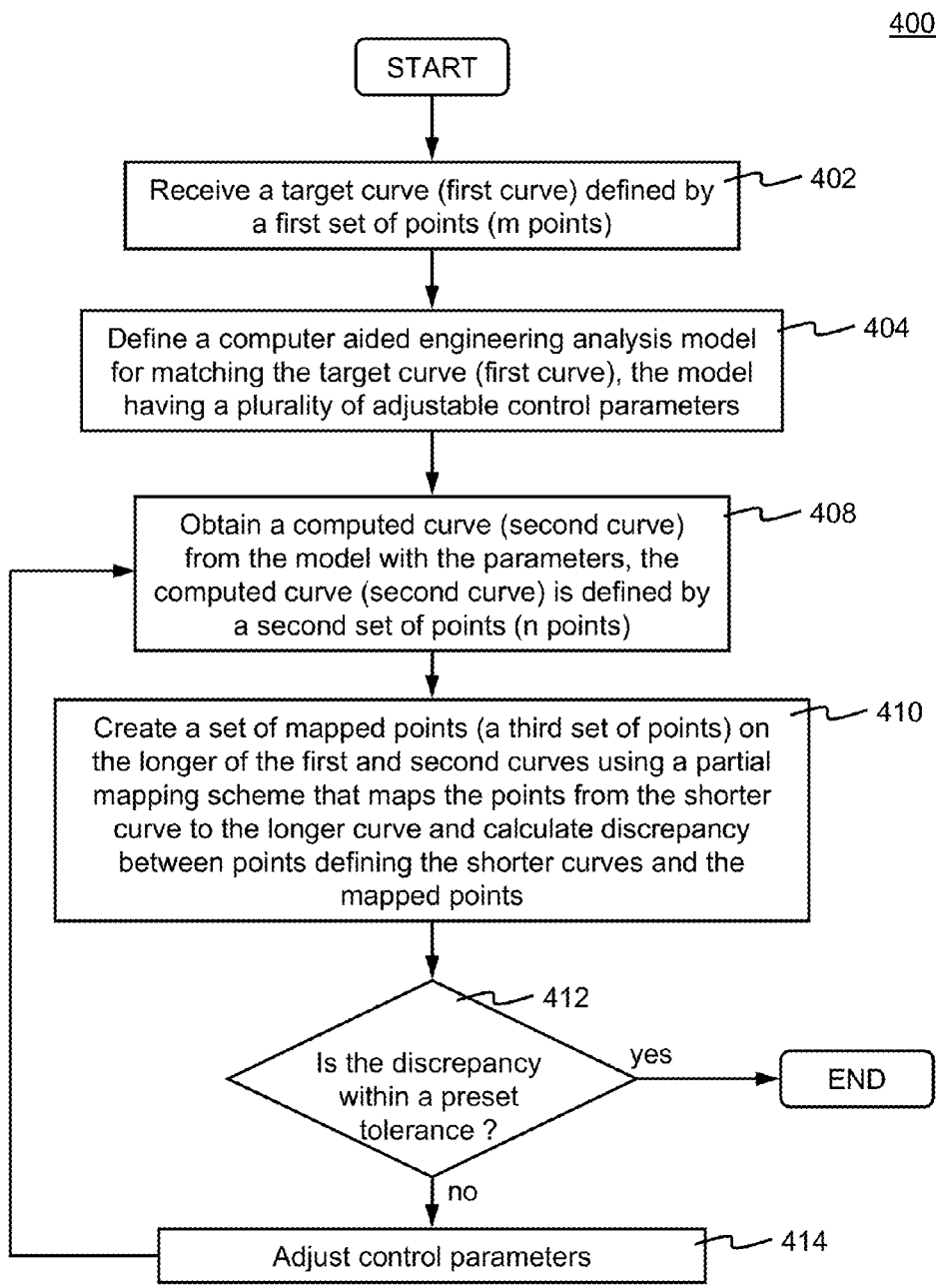
FIGS. 4A-4C show a flowchart illustrating an exemplary process of matching two curves using partial mapping scheme in accordance with another embodiment of the present invention.
Figure 4B:
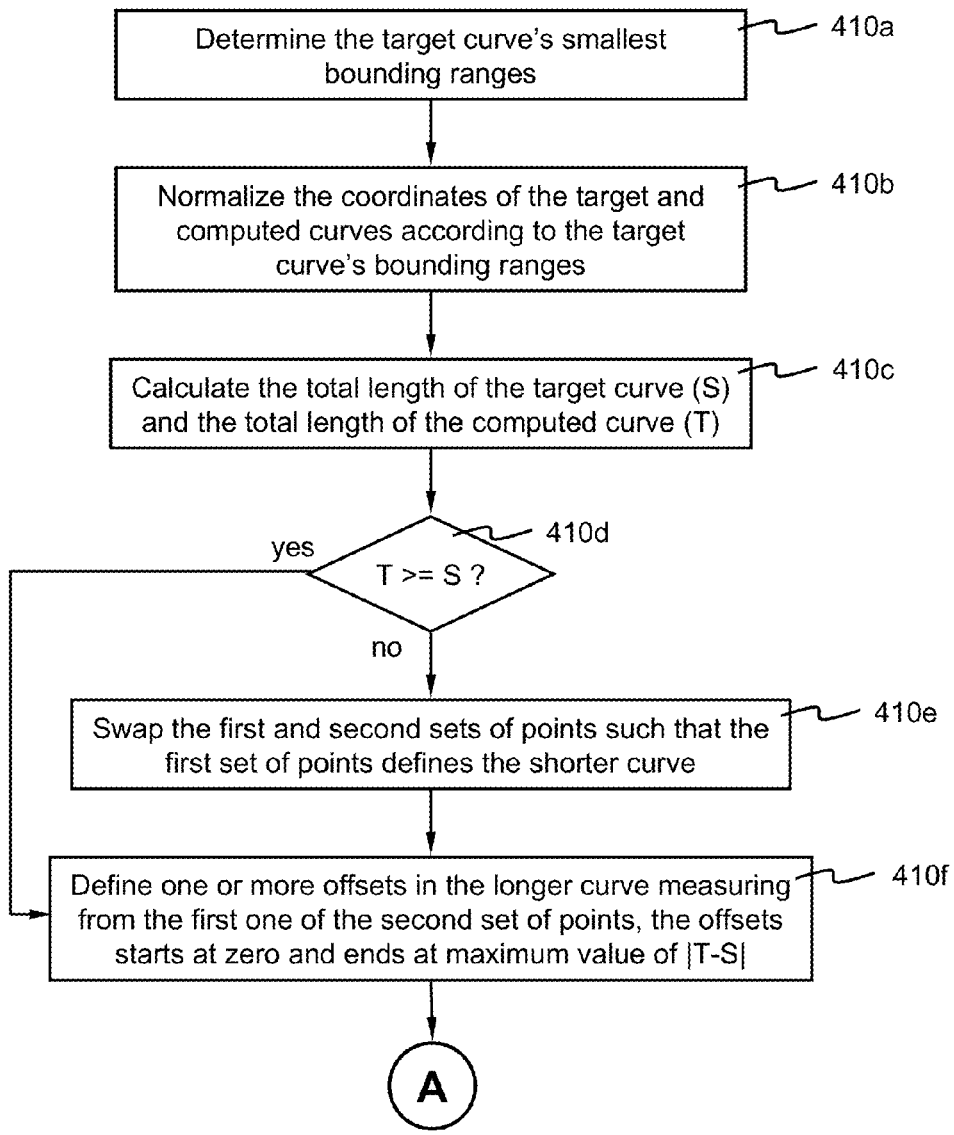
Figure 4C:
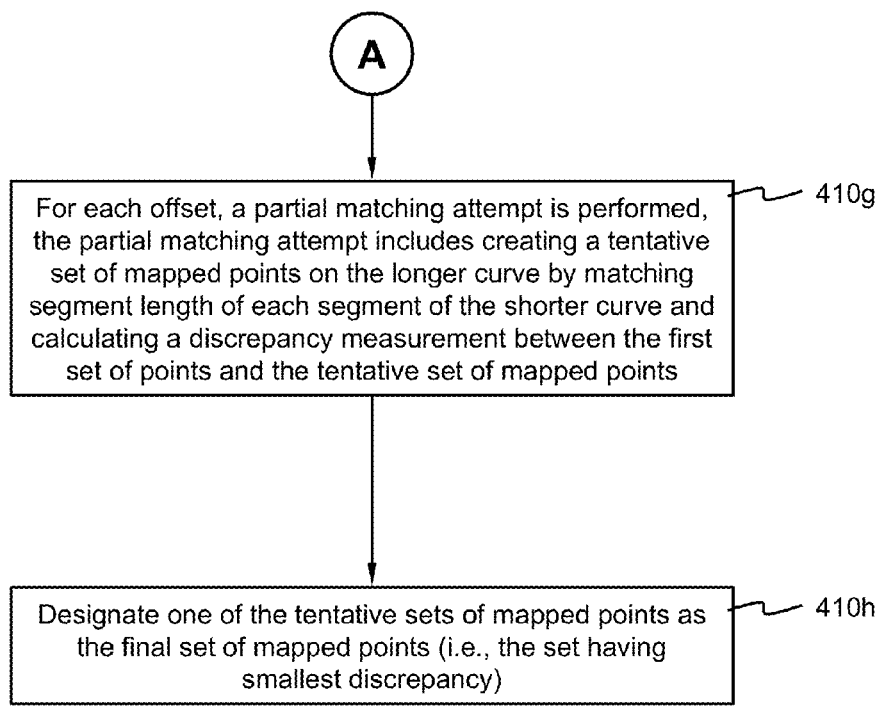

Referring to FIGS. 4A-4C, it is shown a flowchart illustrating an exemplary optimization process 400 for matching a computed curve to a target curve using a computer aided engineering analysis model to enable realistic engineering simulation, according to an embodiment of the present invention. Process 400 is preferably implemented in software, and is preferably understood with previous figures especially FIGS. 3A-3C.

Process 400 starts by receiving a target curve at step 402. The target curve is defined by a first set of points (e.g., "m" points shown in FIG. 3A). One exemplary target curve is strain-stress relationship curve obtained in a material specimen test (e.g., FIG. 1). At step 404, a computer aided engineering (CAE) model (e.g., finite element analysis (FEA) model) is defined for matching the target curve. The CAE model includes a number of control adjustable parameters that can be adjusted as a means for matching a computed curve to the target curve. The computed curve is first obtained using the CAE model with the initial set of parameters at step 408. The computed curve is defined by a second set of points (e.g., "n" points shown in FIG. 3A). Generally, there is no requirement as to how the first set of points and the second set of points relate to each other. In other words, "m" and "n" can be different. Further, there is no requirement as to how the first and second sets of points are distributed, for example, points can be arbitrarily distributed on their respective curves.

Next, at step 410, a set of mapped points (i.e., a third set of points 316 shown in FIG. 3A) is created by mapping those points defining the shorter one of the first and second curves (i.e., the target and computed curves) onto the longer one. The mapping is based on a partial matching scheme (described in details below in flowchart shown FIGS. 4B-4C). After the mapped points are created, a discrepancy measurement identical to that of Process 400 is conducted between the mapped points and the points defining the short curve. At decision 412, it is determined whether the discrepancy change is below a tolerance. If not, the parameters of the CAE model are adjusted at step 414 for creating another computed curve. Process 400 moves back to step 408 to repeat until decision 412 becomes true. Process 400 ends thereafter.

Referring now to FIGS. 4B-4C, at step 410a, the smallest bounding ranges of the target curve (e.g., "Curve F" 302) is determined. In other words, in the x-y coordinate system shown in FIG. 3A, the target curve is bounded between zero (0) and one (1) in either axis. Next, both the target curve and the computed curve (e.g., "Curve G" 304) are normalized to the bounding ranges at step 410b. The total length of target curve (S) and the total length of computed curve (T) are calculated at step 410c. In one embodiment, Equation (3) is used for calculating the length of each segment. The total length is the sum of the length of all segments. At decision 410d, it is determined whether length T is greater than or equal to length S. If 'no', a swapping operation is performed at step 410e. The first and second curves are swapped such that the first set of points always defines the shorter curve. Otherwise, process 400 following the "yes" branch directly to step 410f, in which one or more offsets (e.g., offsets 320 shown in FIGS. 3A-3C) are defined in the longer curve. Offsets are measuring from the first point of the second set of points. The range of the offsets spans from zero to a maximum value, which corresponds to the length difference of the two curves (i.e., |T−S|, absolute value of the difference).

In one embodiment, the number of offsets is determined by the length difference of the two curves. For example, the number of offsets is a function of the ratio of the length difference and the total length of the longer curve. In another embodiment, the number of offsets is statically set by the user based on a priori knowledge. In yet another embodiment, the number of offsets is determined dynamically. For example, the number of partial matching attempts is initially set to a value. After an attempt achieves a discrepancy within a pre-defined tolerance or threshold, process 400 can declare a good match has been found, thereby terminating remaining partial matching attempts.

At step 410g, a partial matching attempt is performed for each offset. The partial matching attempt includes creating a tentative set of mapped points on the longer curve by matching segment length of each corresponding segment of the shorter curve. In the example shown in FIG. 3A, the length of a mapped segment $\delta U_k$ 326 is equal to that of corresponding segment $\delta S_i$ 322. There are a number of ways to measure $\delta U_k$ 326. In one embodiment, $\delta U_k$ 326 is the sum of all segments (full and partial) of the longer curve located between two adjacent mapped points forming $\delta U_k$ 326. In another embodiment, $\delta U_k$ 326 is a straight line distance between two adjacent mapped points forming $\delta U_k$ 326. The present invention does not limit to these procedures, other equivalent procedures can accomplish the same.

After a tentative set of mapped points have been established, a discrepancy measurement is conducted between the mapped points and respective points defining the shorter curve. The discrepancy measurement can be calculated using Equations (5) and (6), or other equivalent procedures.

Next, at step 410h, one of the tentative sets of mapped points is designated as the final set of mapped points (third set of points). Discrepancy measurement can be used for determining the final tentative set of mapped points, for example, smallest discrepancy amongst all partial matching attempts.

A number of partial matching attempts are performed by matching the shorter curve to the longer curve starting from matching respective first points and ending at matching respective last points. These two conditions are shown in FIG. 4B and FIG. 4C, respectively.

Figure 5:
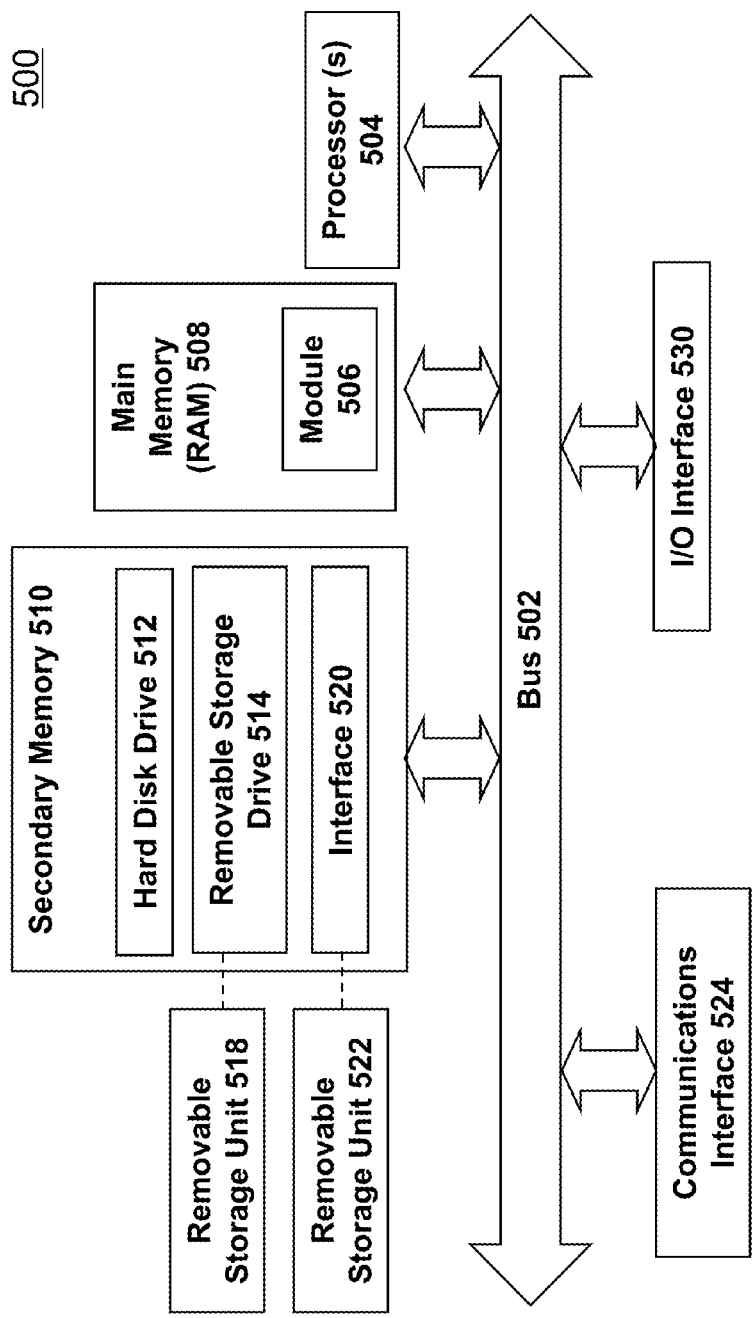
FIG. 5 is a functional block diagram depicting salient components of a computer system used for implementing one embodiment of the invention.

According to one embodiment, the present invention is directed towards one or more computer systems capable of carrying out the functionality described herein. An example of a computer system 500 is shown in FIG. 5. The computer system 500 includes one or more processors, such as processor 504. The processor 504 is connected to a computer system internal communication bus 502. Various software embodiments are described in terms of this exemplary computer system. After reading this description, it will become apparent to a person skilled in the relevant art(s) how to implement the invention using other computer systems and/or computer architectures.

Computer system 500 also includes a main memory 508, preferably random access memory (RAM), and may also include a secondary memory 510. The secondary memory 510 may include, for example, one or more hard disk drives 512 and/or one or more removable storage drives 514, representing a floppy disk drive, a magnetic tape drive, an optical disk drive, etc. The removable storage drive 514 reads from and/or writes to a removable storage unit 518 in a well-known manner. Removable storage unit 518, represents a floppy disk, magnetic tape, optical disk, etc. which is read by and written to by removable storage drive 514. As will be appreciated, the removable storage unit 518 includes a computer usable storage medium having stored therein computer software and/or data.

In alternative embodiments, secondary memory 510 may include other similar means for allowing computer programs or other instructions to be loaded into computer system 500. Such means may include, for example, a removable storage unit 522 and an interface 520. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 522 and interfaces 520 which allow software and data to be transferred from the removable storage unit 522 to computer system 500. In general, Computer system 500 is controlled and coordinated by operating system (OS) software, which performs tasks such as process scheduling, memory management, networking and I/O services.

There may also be a communications interface 524 connecting to the bus 502. Communications interface 524 allows software and data to be transferred between computer system 500 and external devices. Examples of communications interface 524 may include a modem, a network interface (such as an Ethernet card), a communication port, a Personal Computer Memory Card International Association (PCMCIA) slot and card, etc. Software and data transferred via communications interface 524. The computer 500 communicates with other computing devices over a data network based on a special set of rules (i.e., a protocol). One of the common protocols is TCP/IP (Transmission Control Protocol/Internet Protocol) commonly used in the Internet. In general, the communication interface 524 manages the assembling of a data file into smaller packets that are transmitted over the data network or reassembles received packets into the original data file. In addition, the communication interface 524 handles the address part of each packet so that it gets to the right destination or intercepts packets destined for the computer 500. In this document, the terms "computer program medium", "computer readable medium", "computer recordable medium" and "computer usable medium" are used to generally refer to media such as removable storage drive 514 (e.g., flash storage drive), and/or a hard disk installed in hard disk drive 512. These computer program products are means for providing software to computer system 500. The invention is directed to such computer program products.

The computer system 500 may also include an input/output (I/O) interface 530, which provides the computer system 500 to access monitor, keyboard, mouse, printer, scanner, plotter, and alike.

Computer programs (also called computer control logic) are stored as application modules 506 in main memory 508 and/or secondary memory 510. Computer programs may also be received via communications interface 524. Such computer programs, when executed, enable the computer system 500 to perform the features of the present invention as discussed herein. In particular, the computer programs, when executed, enable the processor 504 to perform features of the present invention. Accordingly, such computer programs represent controllers of the computer system 500.

In an embodiment where the invention is implemented using software, the software may be stored in a computer program product and loaded into computer system 500 using removable storage drive 514, hard drive 512, or communications interface 524. The application module 506, when executed by the processor 504, causes the processor 504 to perform the functions of the invention as described herein.

The main memory 508 may be loaded with one or more application modules 506 that can be executed by one or more processors 504 with or without a user input through the I/O interface 530 to achieve desired tasks. In operation, when at least one processor 504 executes one of the application modules 506, the results are computed and stored in the secondary memory 510 (i.e., hard disk drive 512). The status of the analysis (e.g., computed curve) is reported to the user via the I/O interface 530 either in a text or in a graphical representation upon user's instructions.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas two-dimensional curves have been shown and described, other types of curves may be used instead, for example, three-dimensional curves. Additionally, for illustration simplicity, only relative few points are shown in the figures, the present invention does not set any limit to number of points defining either target or computed curve. Further, the calibration of material properties has been shown and described, other types of system can be used instead, for example, a target curve representing a desired system behavior to be matched by tweaking certain design parameters. Furthermore whereas the steps for matching the two curves has been shown and described as a group of equations (Equations (1)-(6)), other equivalent mathematical descriptions of material behaviors can be used instead. Moreover, polygon length has been described and shown for calculating segment length and total length of a curve. Other equivalent procedure can be used instead, for example, a straight-line length. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method executed in a computer system for matching a computed curve to a target curve representing material behaviors in computer aided engineering simulations, said method comprising:

receiving a definition of a target curve by an application module installed in a computer system, the definition being a set of target curve points;

obtaining a computed curve using a computer aided engineering analysis model configured for creating the computed curve via a plurality of control parameters, the computed curve being defined by a set of computed curve points;

calculating the target curve's total polygon length by summing up respective straight-line segment lengths of the target curve's segments, wherein the target curve's segments are located between an adjacent pair of the target curve points;

calculating the computed curve's total polygon length by summing up respective straight-line segment lengths of the computed curve's segments, wherein the computed curve's segments are between an adjacent pair of the computed curve points;

designating a shorter one of the target and the computed curves as a shorter curve and a longer one as a longer curve by comparing the computed curve's total polygon length to the target curve's total polygon length;

conducting one or more partial matching attempts to find a best matching between the shorter curve and a section of the longer curve, each of the partial matching attempts includes placing a set of mapped points on the longer curve such that total length of partial and full straight-line segments on the longer curve between each pair of adjacent mapped points is equal to said corresponding straight-line segment length of the shorter curve, wherein said each of the partial matching attempts starts at respective offsets from starting point of the longer curve;

calculating a discrepancy of each partial matching attempt using a discrepancy measurement based on area between the set of mapped points and the corresponding points on the shorter curve;

designating a particular one of the partial matching attempts having a lowest discrepancy as the best match;

iteratively updating the computed curve by adjusting the control parameters until said lowest discrepancy between the computed and target curves is within a tolerance; and storing the control parameters along with the computer aided engineering analysis model into a file on a storage device coupled to the computer system upon user's instructions.

2. The method of claim 1, wherein said respective offsets ranges from zero to a maximum value that is equal to difference of the target curve's total polygon length and the computed curve's total polygon length.

3. The method of claim 1, wherein the number of said one or more partial matching attempts are based on a ratio of the maximum value of the offsets and the longer curve's total polygon length.

4. The method of claim 1, further comprises:
normalizing coordinates of the target curve points and the computed curve points using the target curve's smallest bounding ranges.

5. The method of claim 1, further comprises transforming coordinates of said each of the mapped points to a common coordinate system of the shorter curve.

6. The method of claim 1, wherein the target curve is a strain-stress relationship curve of a material obtained in a material specimen test.

7. A system for matching a computed curve to a target curve representing material behaviors in computer aided engineering simulations, the system comprising:
a memory for storing computer readable code;
at least one processor coupled to the memory, said at least one processor executing the computer readable code in the memory to cause one or more application modules to perform operations of:
receiving a definition of a target curve by said one or more application modules installed in the system, the definition being a set of target curve points;
obtaining a computed curve using a computer aided engineering analysis model configured for creating the computed curve via a plurality of control parameters, the computed curve being defined by a set of computed curve points;
calculating the target curve's total polygon length by summing up respective straight-line segment lengths of the target curve's segments, wherein the target curve's segments are located between an adjacent pair of the target curve points;
calculating the computed curve's total polygon length by summing up respective straight-line segment lengths of the computed curve's segments, wherein the computed curve's segments are between an adjacent pair of the computed curve points;
designating a shorter one of the target and the computed curves as a shorter curve and a longer one as a longer curve by comparing the computed curve's total polygon length to the target curve's total polygon length;
conducting one or more partial matching attempts to find a best matching between the shorter curve and a section of the longer curve, each of the partial matching attempts includes placing a set of mapped points on the longer curve such that total length of partial and full straight-line segments on the longer curve between each pair of adjacent mapped points is equal to said corresponding straight-line segment length of the shorter curve, wherein said each of the partial matching attempts starts at respective offsets from starting point of the longer curve;
calculating a discrepancy of each partial matching attempt using a discrepancy measurement based on area between the set of mapped points and the corresponding points on the shorter curve;
designating a particular one of the partial matching attempts having a lowest discrepancy as the best match;
iteratively updating the computed curve by adjusting the control parameters until said lowest discrepancy between the computed and target curves is within a tolerance; and
storing the control parameters along with the computer aided engineering analysis model into a file on a storage device coupled to the system upon user's instructions.

8. The system of claim 7, wherein said respective offsets ranges from zero to a maximum value that is equal to difference of the target curve's total polygon length and the computed curve's total polygon length.

9. The system of claim 7, further comprises normalizing coordinates of the target curve points and the computed curve points using the target curve's smallest bounding ranges.

10. A non-transitory computer readable storage medium containing computer executable instructions for matching a computed curve to a target curve representing material behaviors in computer aided engineering simulations by performing a method, said method comprising:
receiving a definition of a target curve by an application module installed in a computer system, the definition being a set of target curve points;
obtaining a computed curve using a computer aided engineering analysis model configured for creating the computed curve via a plurality of control parameters, the computed curve being defined by a set of computed curve points;
calculating the target curve's total polygon length by summing up respective straight-line segment lengths of the target curve's segments, wherein the target curve's segments are located between an adjacent pair of the target curve points;
calculating the computed curve's total polygon length by summing up respective straight-line segment lengths of the computed curve's segments, wherein the computed curve's segments are between an adjacent pair of the computed curve points;
designating a shorter one of the target and the computed curves as a shorter curve and a longer one as a longer curve by comparing the computed curve's total polygon length to the target curve's total polygon length;
conducting one or more matching attempts to find a best matching between the shorter curve and a section of the longer curve, each of the partial matching attempts includes placing a set of mapped points on the longer curve such that total length of partial and full straight-line segments on the longer curve between each pair of adjacent mapped points is equal to said corresponding straight-line segment length of the shorter curve, wherein said each of the partial matching attempts starts at respective offsets from starting point of the longer curve;
calculating a discrepancy of each partial matching attempt using a discrepancy measurement based on area between the set of mapped points and the corresponding points on the shorter curve;
designating a particular one of the partial matching attempts having a lowest discrepancy as the best match;
iteratively updating the computed curve by adjusting the control parameters until said lowest discrepancy between the computed and target curves is within a tolerance; and
storing the control parameters along with the computer aided engineering analysis model into a file on a storage device coupled to the computer system upon user's instructions.

11. The non-transitory computer readable storage medium of claim 10, wherein said respective offsets ranges from zero to a maximum value that is equal to difference of the target curve's total polygon length and the computed curve's total polygon length.

12. The non-transitory computer readable storage medium of claim 10, further comprises normalizing coordinates of the target curve points and the computed curve points using the target curve's smallest bounding ranges.

* * * * *